(12) United States Patent
Agarwal et al.

(10) Patent No.: US 11,393,118 B2
(45) Date of Patent: Jul. 19, 2022

(54) METRICS FOR ASYMMETRIC WAFER SHAPE CHARACTERIZATION

(71) Applicant: KLA CORPORATION, Milpitas, CA (US)

(72) Inventors: Shivam Agarwal, Santa Clara, CA (US); Priyank Jain, Milpitas, CA (US); Yuan Zhong, Milpitas, CA (US); Chiou Shoei Chee, Milpitas, CA (US)

(73) Assignee: KLA CORPORATION, Milpitas, CA (US)

( * ) Notice: Subject to any disclaimer, the term of this patent is extended or adjusted under 35 U.S.C. 154(b) by 221 days.

(21) Appl. No.: 16/897,258

(22) Filed: Jun. 9, 2020

(65) Prior Publication Data

US 2020/0402252 A1    Dec. 24, 2020

Related U.S. Application Data

(60) Provisional application No. 62/863,158, filed on Jun. 18, 2019.

(51) Int. Cl.
*G06T 7/60* (2017.01)
*G01B 11/24* (2006.01)
*G06T 7/00* (2017.01)

(52) U.S. Cl.
CPC .............. *G06T 7/60* (2013.01); *G01B 11/24* (2013.01); *G06T 7/0004* (2013.01); *G01B 2210/56* (2013.01); *G06T 2207/30148* (2013.01)

(58) Field of Classification Search
CPC .............. G06T 7/60; G06T 7/0004; G06T 2207/30148; G06T 7/62; G06T 7/64; G01B 11/24; G01B 2210/56; G01B 2210/48; G01B 11/306; H01L 22/12

USPC ............................................. 382/149
See application file for complete search history.

(56) References Cited

U.S. PATENT DOCUMENTS

| | | | |
|---|---|---|---|
| 9,558,545 B2 | 1/2017 | Vukkadala et al. | |
| 9,779,202 B2 | 10/2017 | Vukkadala et al. | |
| 2008/0208523 A1* | 8/2008 | Schenck | G01B 5/201 |
| | | | 702/155 |
| 2015/0298282 A1 | 10/2015 | Vukkadala et al. | |
| 2016/0371423 A1 | 12/2016 | Vukkadala et al. | |
| 2017/0010540 A1 | 1/2017 | Dmitriev et al. | |
| 2018/0342410 A1 | 11/2018 | Hooge et al. | |

FOREIGN PATENT DOCUMENTS

| | | | | |
|---|---|---|---|---|
| DE | 102007010223 B4 * | 7/2010 | | G01B 5/02 |
| KR | 20090073238 A | 7/2009 | | |
| KR | 20180029884 A | 3/2018 | | |
| WO | 2017202665 A1 | 11/2017 | | |

OTHER PUBLICATIONS ip.com Search history. (Year: 2022).*
WIPO, ISR for International Application PCT/US2020/037831, Sep. 29, 2020.

* cited by examiner

*Primary Examiner* — Roy M Punnoose
(74) *Attorney, Agent, or Firm* — Hodgson Russ LLP

(57) ABSTRACT

Using data about the geometry of the wafer, the geometry of the wafer is measured along at least three diameters originating at different points along a circumference of the wafer. A characterization of the geometry of the wafer is determined using the three diameters. A probability of wafer clamping failure for the wafer can be determined based on the characterization.

20 Claims, 5 Drawing Sheets

METRICS FOR ASYMMETRIC WAFER SHAPE CHARACTERIZATION

CROSS-REFERENCE TO RELATED APPLICATIONS

This application claims priority to the provisional patent application filed Jun. 18, 2019 and assigned U.S. application Ser. No. 62/863,158, the disclosure of which is hereby incorporated by reference.

FIELD OF THE DISCLOSURE

This disclosure relates to characterizing a shape of a semiconductor wafer or other workpiece.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and separated into individual semiconductor devices.

Generally, certain requirements are established for the flatness and thickness uniformity of the wafers. However, the various process steps performed during fabrication may alter stresses in the thin films deposited on the wafers and may result in elastic deformation that can cause significant distortions, including in-plane distortions (IPD) and/or out-plane distortions (OPD). Such distortions may lead to errors in downstream processes. For example, distortions may lead to overlay errors in lithographic patterning or the like.

Metrology processes are used at various steps during a semiconductor manufacturing process to monitor and control one or more semiconductor layer processes. Some of these characteristics include the flatness and thickness uniformity of the wafers. Existing semiconductor standards define metrics such as "bow" and "warp" for wafer shape characterization. These metrics have traditionally been used for bare wafer shape characterization in tools. However, these existing metrics may not fully characterize wafer shapes because these existing metrics do not provide a sense of direction in which wafer shape is distorted and/or by how much. For example, current bow and warp metrics only provide one number per wafer. This does not provide enough information to capture direction and/or angular variation of wafer distortion.

Existing metrology tools support wafer shape metrics along the X and Y direction (i.e., two perpendicular diameters through the center of the wafer). However, all these metrics are one value per wafer and do not characterize asymmetry in wafers shape. This asymmetry in wafer shape can make it difficult to capture and monitor true wafer shape using existing metrics.

Current metrics also do not capture wafer shape asymmetry in a direction that is not X and Y. Currently, wafer maps must be visually inspected one-by-one to determine wafer shape asymmetry. This technique is not accurate and does not provide a precise direction of maximum or minimum wafer shape.

Furthermore, current metrics only capture the maximum warp of the wafer if it occurs in the X or Y direction. Otherwise, the maximum warp is overlooked.

Therefore, new techniques for wafer shape characterization are needed.

BRIEF SUMMARY OF THE DISCLOSURE

A detection system is provided in a first embodiment. The detection system includes an imaging system configured to measure geometry of the wafer and a processor in electronic communication with the imaging system. The processor is configured to: obtain data about the geometry of the wafer; measure the geometry of the wafer along at least three diameters originating at different points along a circumference of the wafer; and determine a characterization of the geometry of the wafer using the three diameters. The detection system can further include a chuck configured to hold the wafer.

The characterization can include a magnitude and direction of maximum shape change for the wafer across the three diameters, an angular warp, a peak point or a valley point, or curvature.

The processor can be further configured to determine a probability of wafer clamping failure for the wafer based on the characterization.

The geometry may be measured along at least thirty-two diameters.

A method is provided in a second embodiment. A method includes receiving data about the geometry of the wafer at a processor. Using the processor, the geometry of the wafer is measured along at least three diameters originating at different points along a circumference of the wafer. Using the processor, a characterization of the geometry of the wafer is determined using the three diameters.

The method can further include imaging the wafer with an imaging system.

The wafer may be a 3D NAND wafer or a DRAM wafer.

The characterization can include a magnitude and direction of maximum shape change for the wafer across the three diameters, an angular warp, a peak point or a valley point, or curvature.

The method can further include determining, using the processor, a probability of wafer clamping failure for the wafer based on the characterization.

The geometry may be measured along at least thirty-two diameters.

In an instance, two of the three diameters are perpendicular to each other.

The data that is received can be for an entire surface of the wafer.

A non-transitory computer readable medium storing a program can be configured to instruct a processor to execute the method of the second embodiment.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1:
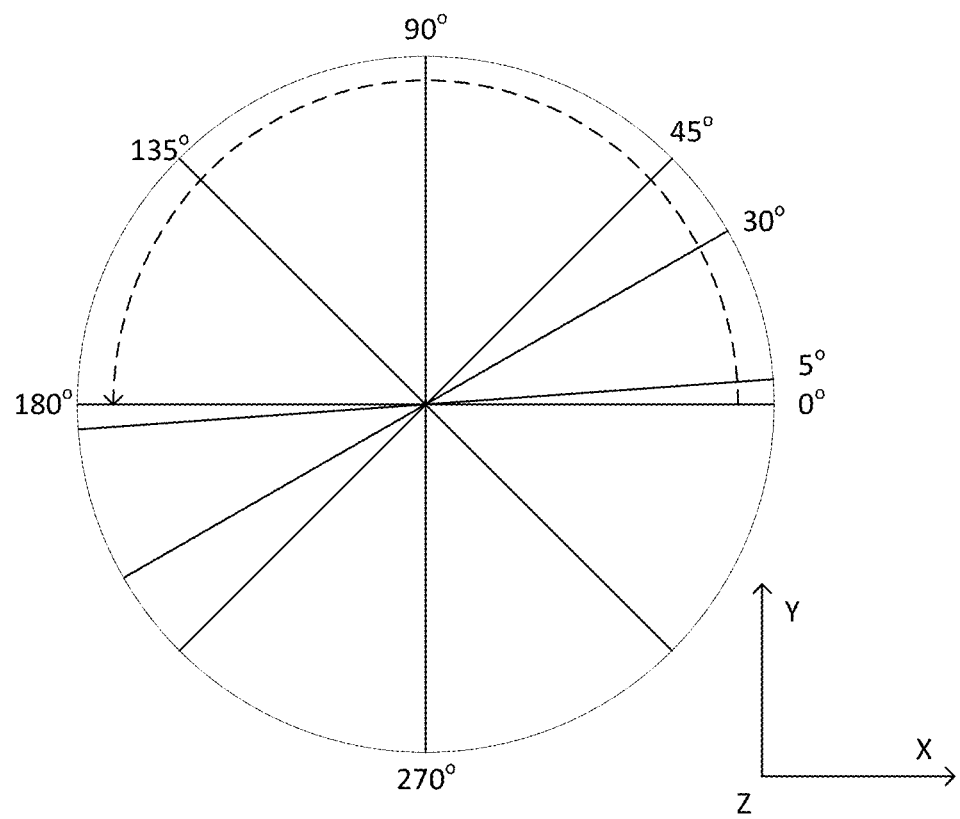
FIG. 1 illustrates a wafer with exemplary angles for angular warp determination.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The embodiments disclosed herein use an angular warp technique to characterize a shape or other geometry of a semiconductor wafer. Existing bow and warp metrics may be helpful wafer shape characterizations for bare wafers or symmetric patterned wafers, but additional characterization is needed for asymmetric wafers like 3D NAND. Partial data only sampled along one directional axis can give semiconductor manufacturers a general idea regarding wafer shape for low warpage in logic or DRAM devices, this is not sufficient for 3D NAND that generally has a higher wafer shape. Additional measurement points from a full wafer helps semiconductor manufacturers obtain the entire view of the wafer.

The disclosed embodiments can characterize wafer shape to capture directional asymmetry. For example, warp values can be determined in any direction as a metric for wafer shape characterization using the embodiments disclosed herein. The metrics described herein can characterize wafer shape during integrated circuit fabrication without visual inspection of individual wafer shape maps. Wafer shape asymmetry (e.g., value or angle) can be automatically determined. This additional characterization can be used with asymmetric wafers to determine if, for example, the wafer shape is too distorted. A semiconductor manufacturer can decide to scrap a wafer that is too distorted or to process a wafer further if the asymmetry is within a tolerable bound.

Angular warp metrics disclosed herein are well-suited for DRAM or 3D NAND devices. However, the embodiments disclosed herein can be customized for different wafer types or different device types.

A PWG measurement system is an example of a wafer metrology system that can measure wafer geometry (e.g., thickness, flatness, or shape). A Patterned Wafer Geometry (PWG) system from KLA Corporation can measure an entire surface of a bare or patterned wafer. A WaferSight measurement system from KLA Corporation is another example of a wafer metrology system that can measure wafer geometry of bare wafers. Such systems may use imaging devices (e.g., double-Fizeau interferometry imaging devices) to make high resolution (e.g., 125 um-500 um pixel width) surface height measurements of front and/or back surfaces of patterned wafers. Other wafer metrology systems also can benefit from the embodiments disclosed herein. These various measurements may be obtained and/or derived using PWG measurement systems or other wafer metrology systems. In an example of a PWG measurement system, the measurements may include wafer frontside height, backside height, thickness variation, flatness, and all consequent derivatives such as shape, and nanotopography.

Embodiments of the present disclosure are directed to systems and methods for providing improved wafer geometry measurements for advanced semiconductor device wafers. The term wafer geometry in the present disclosure refers to wafer front side height, backside height, thickness variation, flatness, and all consequent derivatives such as shape, topography, or the like. The systems and methods in accordance with embodiments of the present disclosure are suitable for handling any types of wafers, including patterned wafers, without the shortcomings of conventional metrology systems.

Angular warp metrics can provide quantifiable and reportable indicators to compute wafer shape at all angles within wafer as shown in FIG. 1. In the example of FIG. 1, measurements are determined along the X-direction (diameter from 0°) and Y-direction (diameter from 90°). However, measurements are also determined along diameters from 5°, 30°, 45°, and 135°. The particular angles that are selected can be based on the process layer, manufacturing process, type of wafer, or devices on the wafer. If wafer data exists for the entire wafer surface, then measurements can be determined at any angle. Otherwise, measurements can be taken at selected angles.

Figure 2:
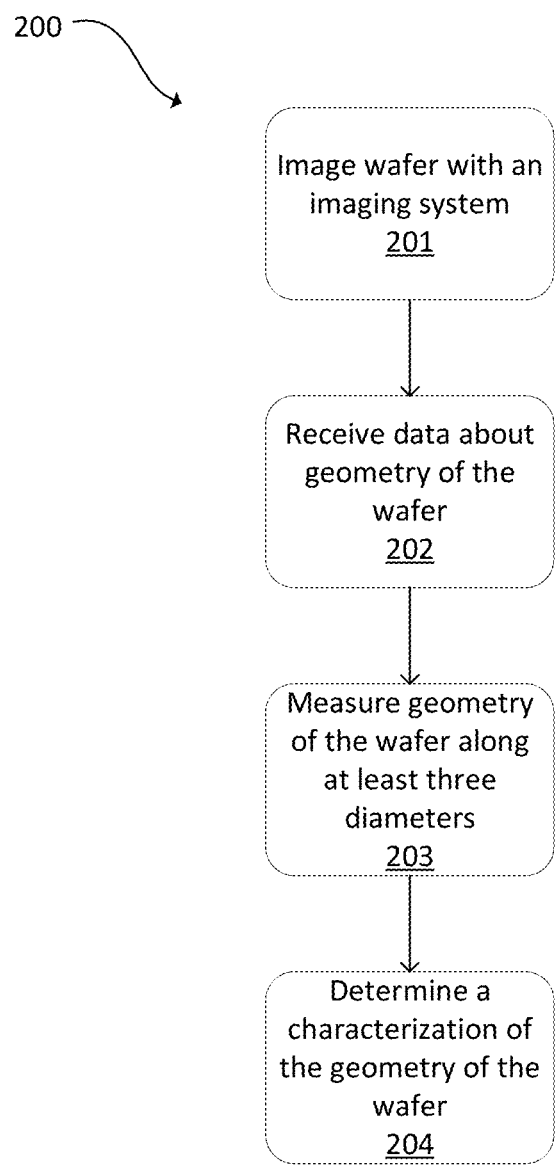
FIG. 2 is a flowchart of an embodiment of a method in accordance with the present disclosure.

FIG. 2 is a flowchart of an embodiment of a method 200. A wafer is imaged with an imaging system while the wafer is held on a chuck at 201. The wafer also can be held on pins or using a vacuum grip. The wafer may be, for example, a 3D NAND or DRAM wafer. Data about the geometry of the wafer is received at a processor at 202. This data can include information about the wafer surface, topography, or shape. The data about the geometry of the wafer may be from the imaging system.

While 3D NAND and DRAM wafers are specifically disclosed, other memory or logic wafers can be used. Other wafers may exhibit asymmetrical shape and can benefit from angular warp metrics.

Using the processor, the geometry of the wafer is measured along at least three diameters at 203. The three diameters originate at different points along a circumference of the wafer. While at least three diameters are mentioned, measuring along thirty-six or seventy-two diameters is possible. Thus, diameters can be positioned across every 5° or every 10° around a circumference of a wafer. For example, FIG. 1 includes measurements along six diameters, but thirty-two diameters may be used. Wafer shape may not vary much for less than 5° separation, so thirty-two diameters may be sufficient to calculate the full wafer shape. However, more than thirty-two diameters may be beneficial for certain wafer types. In an instance, at least two of the diameters are perpendicular to each other.

In an instance, the height of front and back surface of wafer (Z-height) for every pixel (for example every 60 μm in the X-direction and Y-direction) and other wafer geometry parameters like shape, thickness, or flatness can be derived from this Z-height.

X-direction and Y-direction measurements (e.g., 0° and 90° in FIG. 1) may be sufficient when wafer shape is low. For example, if wafer shape is measured only in the X-direction (resulting in, e.g., 120 μm), this will miss a maximum measurement at 45° (resulting in, e.g., 150 μm). This 25% increase may not result in much process significance if the warpage is low. However, as 3D NAND technology continues to advance, the overall warpage is much higher with more stacks. Using a 3D NAND example, if wafer shape is measured in the X-direction (resulting in, e.g., 320 µm), this will miss a maximum measurement at 45° (resulting in, e.g., 400 µm). The 25% increase in the 3D NAND example can cause process tool down events due to the maximum chucking capability limit. Many process tools (e.g., scanners) use a vacuum chuck so higher warp wafers are more difficult to chuck.

At 204, a characterization of the geometry of the wafer is determined using the three or more diameters. The characterization can include a magnitude and direction of maximum shape change for the wafer across the three diameters. The characterization also can include an angular warp, a peak point, a valley, or curvature. Other characterizations may be possible.

In an instance, values are obtained or received at any given axis and/or diameter. Thus, any summarizing statistic calculated on those points can be used as a characterization metric. For example, three sigma, mean, range, peak (max), or other determinations can be made. These points can be used to fit a curve and then calculate statistics for that curve, which can be performed in curvature fitted metrics (e.g., Angular Warp-CF, which can be in the X, Y, or X and Y directions). This curve can be of any order. For example, a second order curve can be used in curvature fit (CF) based metrics.

A probability of wafer clamping failure for the wafer can be determined using a processor based on the characterization. This may determine if wafer warpage exceeds a limit that the chuck can handle. Different process tools used different chucks, so the determination may be for a specific tool. For example, after 200 wafer measurements the data is analyzed and it can be found that wafers with angular warp>400 µm along more than 10 diameters/directions (out of 32) have 90% probability of clamping failure. Semiconductor manufacturers can use this criterion to identify and/or isolate these potentially problematic wafers. Thus, a threshold for a particular tool or chuck can be applied to the results to determine probability of clamping failure.

Embodiments disclosed herein can be used to provide the following metrics along any of the diameters that are measured. Other metrics are possible. The metrics can be selected for asymmetric wafers, but can vary based on the particular semiconductor manufacturer and particular process step.

An angle at which a warp curvature fit value can be determined. Curvature fit is the process of fitting a mathematical function/curve to a series of data points and can determine a best and/or closest circle that can fit to the given data points. This include a second order fit (i.e., a circle) because second order fit is what defines wafer shape. However, curvature fit can be of any order.

A highest point (Z-height) on a shape profile (signed) can be determined. It can be defined for every radial profile. A distance of the peak point (signed) from center of wafer can be determined. A curvature fit radius of curvature also can be reported.

A lowest point (Z-height) on a shape profile (signed) can be determined. It can be defined on every radial profile. A distance of the valley point (signed) from center of wafer can be determined. A curvature fit radius of curvature also can be reported.

A maximum or minimum of all angular warp curvature fits can be determined.

A maximum magnitude (after ignoring sign) out of all angular warp curvature fits can be reported with its sign (positive or negative).

Angular warp metrics disclosed herein provide advantages. True wafer shape for asymmetric wafers can be determined. Currently-available metrics are unable to capture maximum wafer shape, especially in non-X and non-Y directions that leads to false positives for scanner and process tools chucking tolerance. For example, a maximum may not be on the diameters from 0°-180° or 90°-270°. This may lead to incorrect rejections of wafers when determining if the wafers can be chucked. Angular warp metrics as disclosed herein can provide metrics that can accurately flag these falsely rejected wafers and, hence, can save time and money for semiconductor manufacturers.

Angular warp metrics can capture directional asymmetry and process irregularities such as chamber-to-chamber variations, etch slants, or other irregularities early in the semiconductor manufacturing process. If a process is stable and all process chambers are matched, then the wafer shape signatures should ideally be the same. However, this is not usually the case. Even if incoming wafers for one process are similar, by post-process these wafers have different signatures. Angular warp detects this signature from a warpage perspective. If one wafer is an outlier from the other twenty-four wafers in the same foup, then there is an indication of excursion of process chamber that the one wafer experienced.

Multiple metrics or indicators per wafer can lead to a more comprehensive wafer shape characterization. While at least three diameters are disclosed, 360 diameters or more can be used.

Angular warp metrics can be used to capture and monitor magnitude of wafer shape changes across the semiconductor manufacturing flow or within a process (e.g., wafer-to-wafer variation). Angular warp metrics also can monitor how the direction of maximum shape changes within a process or across processes.

Figure 3:
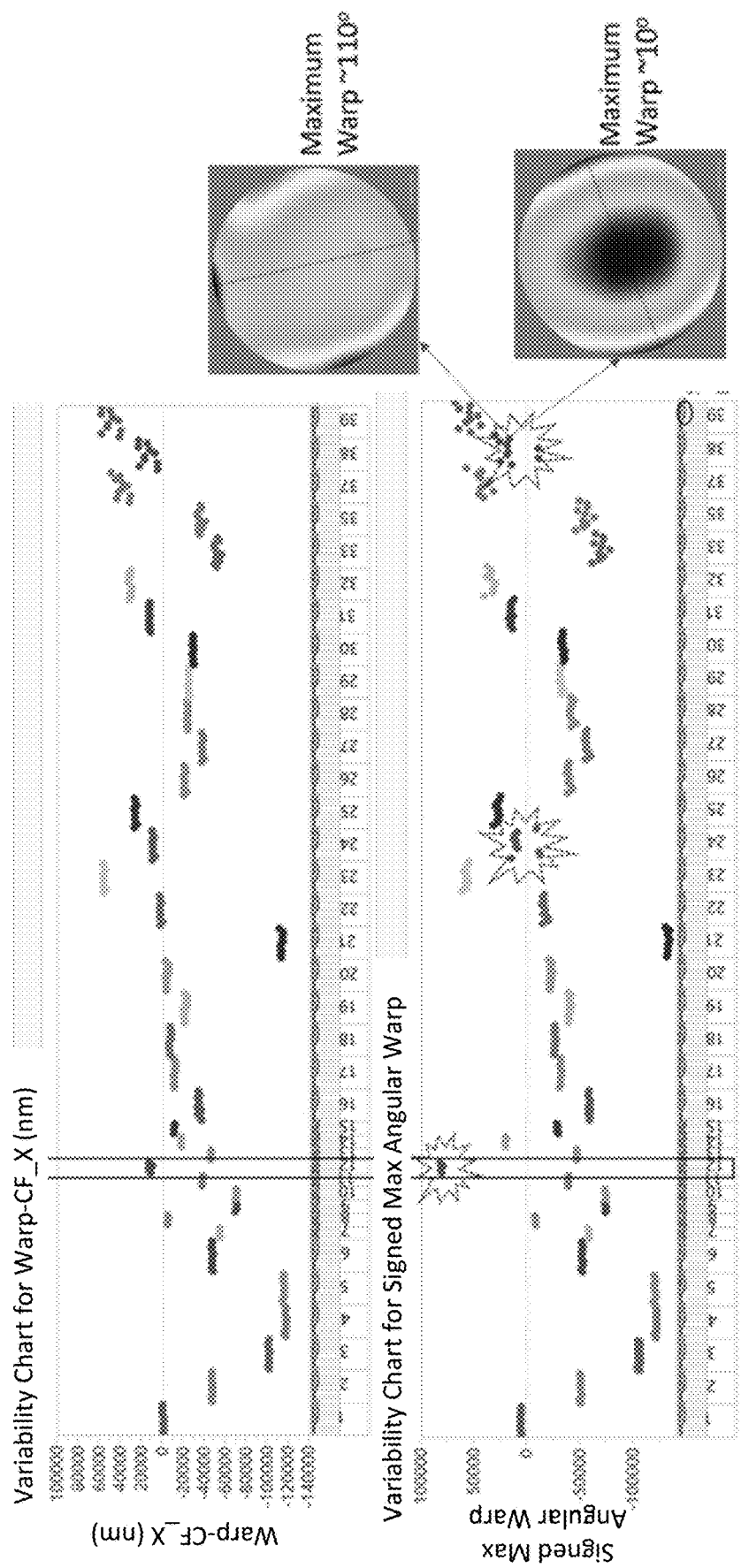
FIG. 3 comparing angular warp metrics (bottom) compared to previous metrics (top)

FIG. 3 comparing angular warp metrics (bottom) compared to previous metrics (top). Angular warp metrics can capture the true warp values better than previous techniques that only measured in the X-direction and perpendicular Y-direction. In the example of FIG. 3, magnitude and direction of maximum wafer shape change across processes and within a process is captured. Traditional wafer shape metrics such as Bow-X/Warp-X and Bow-Y/Warp-Y will capture the wafer shape only in X-direction or Y-direction. A segmentation study on approximately forty process layers for a DRAM device was performed. FIG. 3 includes segmentation using traditional warp metric (top graph) and angular warp metric disclosed herein (bottom graph).

For step 12, the previous metric provided a warp value of about 20 µm and this layer registered as low stress process. However, upon segmentation using angular warp, a more accurate wafer shape of this layer was determined, which was 80 µ. With angular warp values, a semiconductor manufacturer could flag this layer for critical process monitoring. These results also can help reduce process drifts and improve cycle time.

The previous metric shows that within-lot variation for step 24 is well-controlled. However, angular warp data on this process determined 50 µm of within lot variability at step 24.

Figure 4:
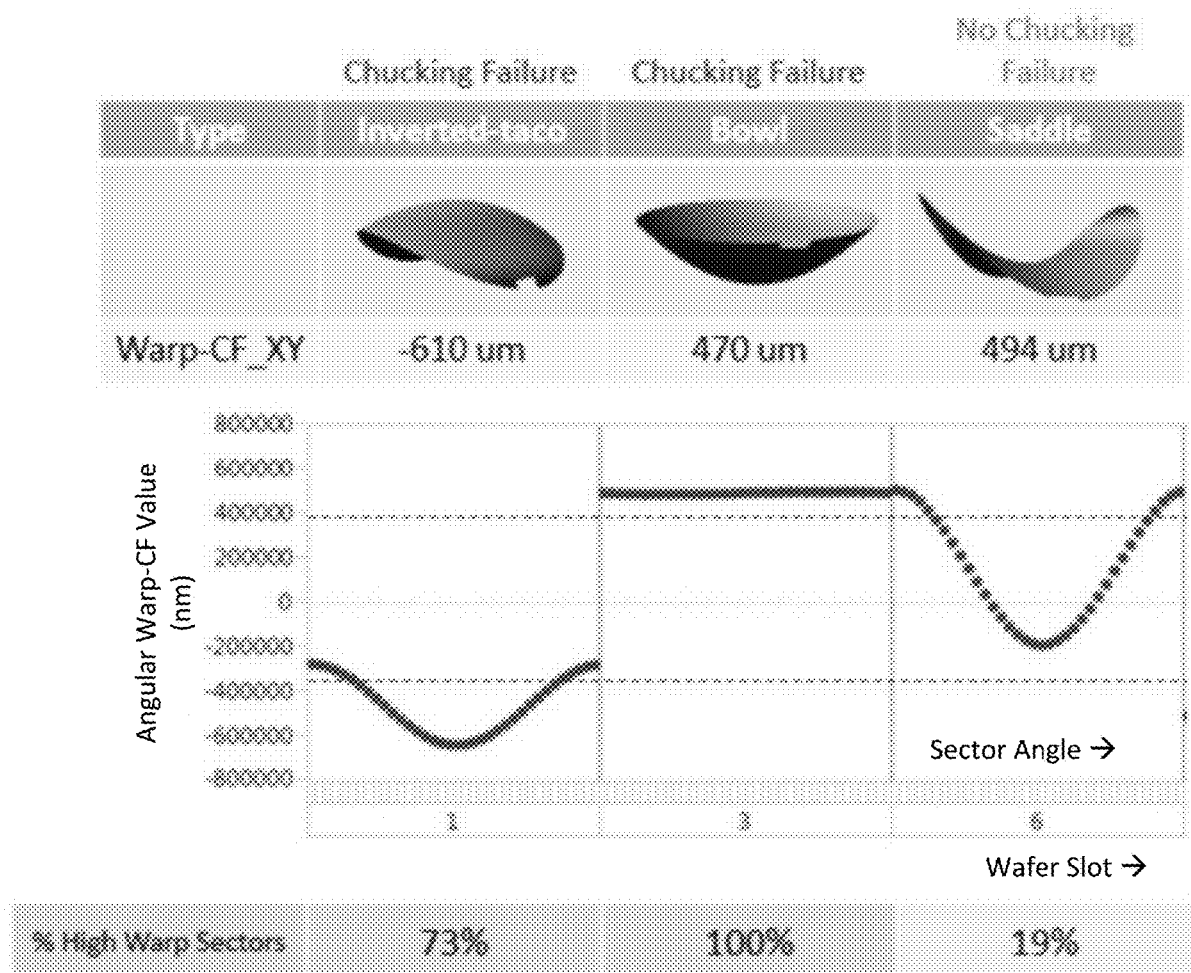
FIG. 4 illustrates an example of chucking failure.

FIG. 4 illustrates an example of chucking failure. Angular warp can be helpful to detect false positives that are rejected by previous metrics and that may not actually cause chucking failure on process tools. The previous technique indicates that wafer warpage is 494 µm, which exceeds a process tool limit (e.g., scanner limit of 400 µm). Using a wafer that exceeds the limit will cause a tool down event that is costly or time-consuming to correct. However, with angular warp technique, actually most parts of this wafer are below 400 µm, which is acceptable for the scanner to process. These saves a semiconductor manufacturer wafer rework cost.

In FIG. 4, wafer slot 6 is falsely detected as a chucking failure wafer using previous techniques. A traditional warp specification is 350 µm, which rejects all three wafers using the previous technique (Warp-CF_XY). With the angular warp embodiments disclosed herein, if 70% high warp sectors are encountered, then the wafer is rejected. The 70% high warpage sectors are shown as beyond the dotted lines. Thus, only two of the three wafer will be rejected for clamping failure.

As illustrated by the example in FIG. 4, two different wafers having 450 µm of shape determined using previous warp metrics will behave differently when subjected to chucking on a scanner tool. A wafer with a symmetric shape can cause chucking failure. A wafer having asymmetric shape will probably be chucked without problems. By screening using angular warp, semiconductor manufacturers can provide better specifications for rejecting wafers for potential chucking failures. This can result in fewer wafer rejects and will save resources for a semiconductor manufacturer.

Figure 5:
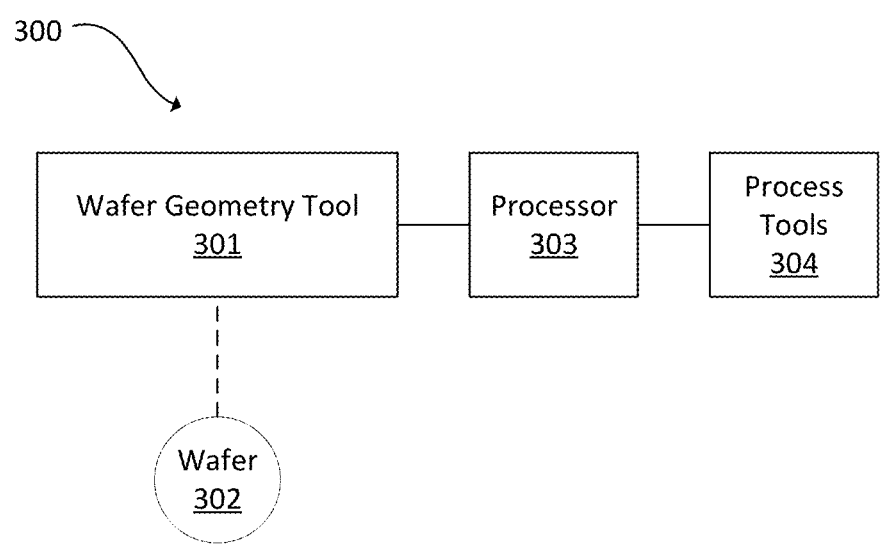
FIG. 5 is an embodiment of a detection system in accordance with the present disclosure.

FIG. 5 is an embodiment of a detection system 300. The detection system 300 is configured to detect, quantify, and control process-induced asymmetric signatures using patterned wafer geometry measurements. The detection system 300 may include a wafer geometry tool 301 configured to measure wafer geometry of a given wafer 302. The detection system 300 may also include a processor 303 in electronic communication with the wafer geometry tool 301. The processor 303 may be configured to carry out the various analysis methods previously described. The processor 303 may be implemented as a standalone processing device or as an embedded/integrated component of the wafer geometry tool 301. The processor 303 may provide its output to various process tools 304 to facilitate correction of overlay errors, root-cause analysis as well as process control optimizations as described above.

The wafer geometry tool 301 can include a chuck configured to hold the wafer 302 and an imaging system configured to measure geometry of the wafer 302. The imaging system may be an optical system.

The wafer geometry tool 301 can collect all wafer data for a surface in a single shoot. The wafer geometry tool 301 also can rotate and scan the wafer to construct the required wafer map.

The processor 303 may be coupled to the components of the detection system 300 in any suitable manner (e.g., via one or more transmission media, which may include wired and/or wireless transmission media) such that the processor 303 can receive output. The processor 303 may be configured to perform a number of functions using the output. The detection system 300 can receive instructions or other information from the processor 303.

The processor 303, other system(s), or other subsystem(s) described herein may be part of various systems, including a personal computer system, image computer, mainframe computer system, workstation, network appliance, interne appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 303 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 303 to implement various methods and functions may be stored in readable storage media.

If the detection system 300 includes more than one processor 303, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 303 may be configured to perform a number of functions using the output of the detection system 300 or other output. For instance, the processor 303 may be connected to a storage medium. The processor 303 may be further configured as described herein.

The processor 303 may be configured according to any of the embodiments described herein. The processor 303 also may be configured to perform other functions or additional steps using the output of the detection system 300 or using images or data from other sources.

Various steps, functions, and/or operations of detection system 300 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 303 or, alternatively, multiple processors 303. Moreover, different sub-systems of the detection system 300 may include one or more computing or logic systems. Therefore, the above description should not be interpreted as a limitation on the present disclosure but merely an illustration.

In an instance, the processor 303 is in communication with the detection system 300. The processor 303 is configured to obtain data about the geometry of the wafer 302; measure the geometry of the wafer 302 along at least three diameters originating at different points along a circumference of the wafer 302; and determine a characterization of the geometry of the wafer 302 using the three diameters.

An additional embodiment relates to a non-transitory computer-readable medium storing program instructions executable on a controller for performing a computer-implemented method for determining characterization of geometry of a wafer, as disclosed herein. In particular, an electronic data storage unit or other storage medium may contain non-transitory computer-readable medium that includes program instructions executable on the processor 303. The computer-implemented method may include any step(s) of any method(s) described herein, including method 100.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), Streaming SIMD Extension (SSE), or other technologies or methodologies, as desired.

The advantages provided by the systems and methods in accordance with the present disclosure may be appreciated in various applications. Both detection and quantification of asymmetry may be performed at any given process step, and the estimation can be performed purely based on wafer geometry. The accuracy of the asymmetry estimation can be improved compared to conventional lithography scanners which use vacuum chucks and have much lower spatial sampling available.

While some of the examples above referred to certain specific process tools, the systems and methods in accordance with the present disclosure are applicable to other types of process tools, which may also benefit from resolution-enhanced measurements without departing from the scope of the present disclosure. In addition, it is contemplated that the term wafer used in the present disclosure may include a thin slice of semiconductor material used in the fabrication of integrated circuits and other devices, as well as other thin polished plates such as magnetic disc substrates, gauge blocks, and the like.

The methods disclosed herein may be implemented in various wafer geometry measurement tools as sets of instructions executed by one or more processors, through a single production device, and/or through multiple production devices. Further, the specific order or hierarchy of steps in the methods disclosed are examples of exemplary approaches. Based upon design preferences, the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A detection system comprising:
   an imaging system configured to measure geometry of a wafer; and
   a processor in electronic communication with the imaging system, wherein the processor is configured to:
      obtain data about the geometry of the wafer;
      measure the geometry of the wafer along at least three diameters originating at different points along a circumference of the wafer; and
      determine a characterization of the geometry of the wafer using the three diameters.

2. The detection system of claim 1, wherein the characterization includes a magnitude and direction of maximum shape change for the wafer across the three diameters.

3. The detection system of claim 1, wherein the characterization includes an angular warp.

4. The detection system of claim 1, wherein the characterization includes a peak point or a valley point.

5. The detection system of claim 1, wherein the characterization includes curvature.

6. The detection system of claim 1, wherein the processor is further configured to determine a probability of wafer clamping failure for the wafer based on the characterization.

7. The detection system of claim 1, wherein the geometry is measured along at least thirty-two diameters.

8. The detection system of claim 1, further comprising a chuck configured to hold the wafer.

9. A method comprising:
   receiving data about the geometry of the wafer at a processor;
   measuring, using the processor, the geometry of the wafer along at least three diameters originating at different points along a circumference of the wafer; and
   determining, using the processor, a characterization of the geometry of the wafer using the three diameters.

10. The method of claim 9, further comprising imaging the wafer with an imaging system.

11. The method of claim 9, wherein the wafer is a 3D NAND wafer or a DRAM wafer.

12. The method of claim 9, wherein the characterization includes a magnitude and direction of maximum shape change for the wafer across the three diameters.

13. The method of claim 9, wherein the characterization includes an angular warp.

14. The method of claim 9, wherein the characterization includes a peak point or a valley point.

15. The method of claim 9, wherein the characterization includes curvature.

16. The method of claim 9, further comprising determining, using the processor, a probability of wafer clamping failure for the wafer based on the characterization.

17. The method of claim 9, wherein the geometry is measured along at least thirty-two diameters.

18. The method of claim 9, wherein two of the three diameters are perpendicular to each other.

19. The method of claim 9, wherein the data is for an entire surface of the wafer.

20. A non-transitory computer readable medium storing a program configured to instruct a processor to execute the method of claim 9.

* * * * *